United States Patent [19]
Kobayashi et al.

[11] Patent Number: 5,759,426
[45] Date of Patent: Jun. 2, 1998

[54] HEAT TREATMENT JIG FOR SEMICONDUCTOR WAFERS AND A METHOD FOR TREATING A SURFACE OF THE SAME

[75] Inventors: Norihiro Kobayashi; Kazuo Mamada; Yuichi Matsumoto; Satoshi Oka; Masatake Katayama, all of Annaka, Japan

[73] Assignee: Shin-Etsu Handotai Co., Ltd., Tokyo, Japan

[21] Appl. No.: 558,540

[22] Filed: Nov. 16, 1995

[30] Foreign Application Priority Data

Nov. 17, 1994 [JP] Japan ................... 6-308243

[51] Int. Cl.$^6$ ................................. H01L 21/302
[52] U.S. Cl. ................. 216/79; 427/309; 427/402; 427/534; 134/1.3
[58] Field of Search ......................... 427/307, 309, 427/402, 534, 535, 588; 216/64, 79; 134/1.3

[56] References Cited

U.S. PATENT DOCUMENTS 4,865,685  9/1989  Palmour ..................... 156/643.1
5,494,524  2/1996  Inaba et al. .................. 118/728

FOREIGN PATENT DOCUMENTS

| 43 42976 A1 | 6/1994 | Germany . |
| 57-53930A | 3/1982 | Japan . |
| A-57 053930 | 3/1982 | Japan . |
| 59-191327A | 10/1984 | Japan . |
| A-59-191327 | 10/1984 | Japan . |
| 3-285884A | 12/1991 | Japan . |
| A-03 285884 | 3/1992 | Japan . |
| 5-243169A | 9/1993 | Japan . |
| 6-224281A | 8/1994 | Japan . |
| A-06 224281 | 12/1994 | Japan . |

*Primary Examiner*—R. Bruce Breneman
*Assistant Examiner*—Anita Alanko
*Attorney, Agent, or Firm*—Ronald R. Snider

[57] ABSTRACT

A silicon nitride layer 12b is thermally grown on the topmost surface of the heat treatment jig 12 composed of silicon or silicon carbide in a nitrogen ambience. The silicon nitride layer 12b is thermally grown in a nitrogen ambience in the temperature range of 1,100° C.–1,300° C. It is desirable to remove slightly the surface of the jig by, for example, hydrogen etching before thermally growing the silicon nitride layer 12b. After the etching, a silicon oxide layer can be thermally grown on the jig surface in an oxygen ambience before thermally growing the silicon nitride layer 12b.

2 Claims, 1 Drawing Sheet

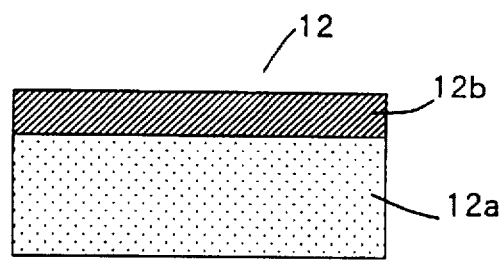
F I G. 1
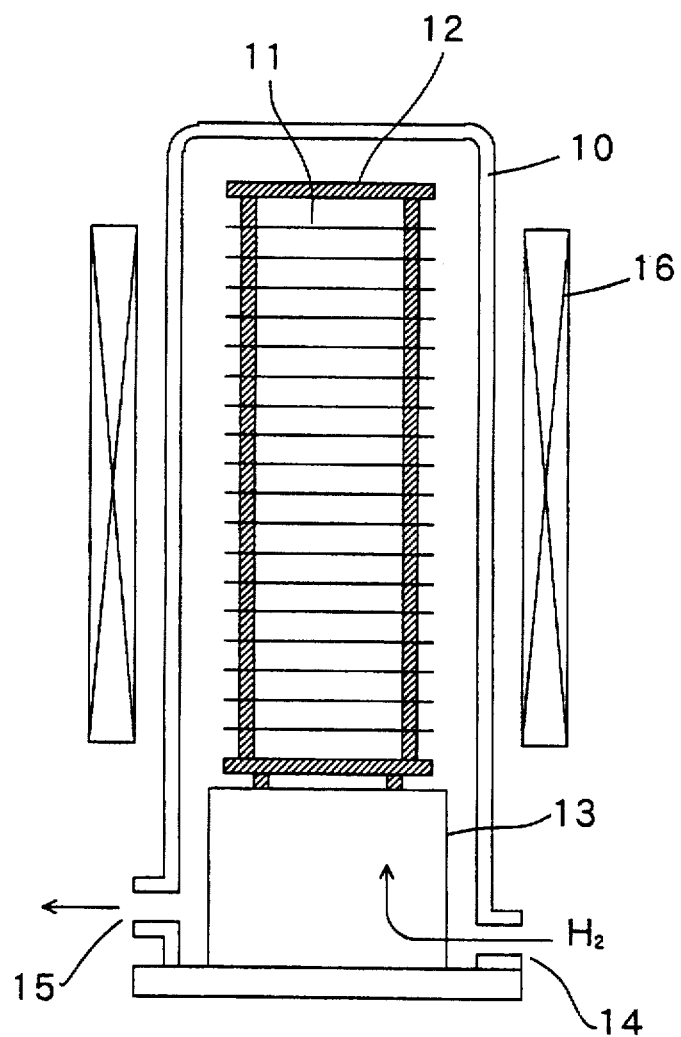
F I G. 2

HEAT TREATMENT JIG FOR SEMICONDUCTOR WAFERS AND A METHOD FOR TREATING A SURFACE OF THE SAME

RELATED APPLICATION

This application claims the priority of Japanese Patent application No. 6-308243 filed on Nov. 17, 1994, which is incorporated herein by reference.

BACKGROUND OF THE INVENTION

1. Field of the Invention

This invention relates to a heat treatment jig for semiconductor wafers and a method for treating a surface of the same, and more particularly, to a heat treatment jig for semiconductor wafers such as single crystal wafers without causing contamination when using in the heat treatment and a method for treating a surface of the same.

2. The Prior Art

In a manufacturing process of semiconductor devices, silicon materials and such are used for manufacturing high performance VLSIs, ULSIs, etc. These silicon materials are wafer-shaped, generally called a silicon single crystal wafer. The desired devices are formed on the surface or near the surface of the silicon single crystal wafer.

There are crystal defects related to interstitial oxygen and such existing in the silicon single crystal wafer, and it is necessary to remove the crystal defects near the wafer surface where the devices are formed. In order to denude the crystal defects near the wafer surface, a high temperature heat treatment, called a high temperature annealing, is adopted in which a silicon single crystal wafer which is placed on a heat treatment jig, i.e. a wafer boat is inserted into a heat treatment furnace and heated to a high temperature. In recent years, it has been found that a high temperature annealing in a hydrogen ambience is effective for complete denudation of the vicinity of the surface of semiconductor wafers.

FIG. 2 shows one example of a vertical-type heat treatment furnace used for the high temperature annealing. In this figure, a tube 10 contains a boat supporting mount 13 on which a wafer boat 12 is placed. A plurality of silicon single crystal wafers 11 are held on the wafer boat 12. When conducting the high temperature annealing of the silicon single crystal wafers 11, the temperature is increased up to 1,200° C. by a heater 16, while ambient gas is supplied through a gas introduction port 14. The ambient gas goes out through a gas exhaust port 15 after the annealing.

Examples of the material of the wafer boat 12 used for the high temperature annealing include quartz, silicon and silicon carbide. A wafer boat made of quartz has an advantage of a higher level cleanliness, but also has a disadvantages in that it is prone to deformation because softening occurs at temperatures higher than 1,140° C. A wafer boat made of silicon has an advantage in reducing slippage of the silicon single crystal wafers during the heat treatment, but also has a disadvantage in that it sticks to the silicon single crystal wafers which are made of the same material at temperatures higher than 1,100° C. A wafer boat made of silicon carbide has an advantage in having enough strength, but has a disadvantage of low level cleanliness due to the diffusion of impurities from inside the wafer boat.

To prevent such problems, a method has been proposed in which a protective layer is deposited on the surface of the wafer boat by the chemical vapor deposition (CVD).

However, the protective layer deposited by CVD has minute holes such as so-called pin-holes, and it is insufficient for preventing the out-diffusion of impurities from inside the wafer boat. Additionally, the minute holes tend to develop into cracks during the high temperature annealing, and the particles may contaminate the wafer surface.

Furthermore, if a wafer boat, which is used in in so-called hydrogen annealing in which a hydrogen ambience is introduced during the high temperature annealing, is coated with silicon oxide as a protective layer deposited by CVD and/or is made of quartz, there generates water by a reaction between the oxygen which composes the protective layer or boat materials and hydrogen, and then the water reacts with the wafer and the surface silicon of the silicon single crystal wafer, resulting in generation of pit-like defects.

BRIEF SUMMARY OF THE INVENTION

The object of the invention is to provide a heat treatment jig for semiconductor wafers without sticking to the semiconductor wafers.

The another object of the invention is to provide a heat treatment jig for semiconductor wafers by which the out-diffusion of impurities from the heat treatment jig is controlled sufficiently and easily The further object of the invention is to provide a heat treatment jig for semiconductor wafers by which harmful effects such as the generation of pit-like defects is prevented during hydrogen annealing.

In order to solve the problems described above, in the heat treatment jig of the present invention, a silicon nitride layer is thermally grown on the topmost surface of the heat treatment jig composed of silicon or silicon carbide in a nitrogen ambient.

Said silicon nitride layer may be thermally grown on the surface of a protective layer deposited with CVD on the heat treatment jig.

In the surface treatment method of the heat treatment jig of the present invention, a silicon nitride layer is thermally grown on a surface of the heat treatment jig composed of silicon or silicon carbide in a nitrogen ambient in the temperature range of 1,100° C.–1,300° C.

In this method, it is desirable to remove slightly the surface of the heat treatment jig by etching before thermally growing the silicon nitride layer. It is desirable to conduct the etching by introducing hydrogen gas at a high temperature (hereafter referred to as "hydrogen etching"). Also, it is desirable to form said silicon nitride layer after etching the surface of the heat treatment jig and then thermally growing a silicon oxide layer in an oxygen ambience.

In the present invention, the silicon nitride layer is thermally grown on the wafer boat surface in a nitrogen ambience. The silicon nitride layer is a dense layer, compared with a silicon nitride layer deposited with CVD, and it possible to prevent the diffusion of metallic impurities from the inside the wafer boat to the outside. Also, since the thermally grown silicon nitride layer is different from the wafer material, it does not stick to the silicon single crystal wafer during the high temperature annealing.

If the heat treatment is conducted in a hydrogen ambience, the wafer boat surface is slightly etched (hydrogen etching) and the impurity-containing layer on said surface is removed and the surface is made active. A clean and dense silicon nitride layer can be formed by conducting a heat treatment on the active surface directly in a nitrogen ambience. A thicker silicon nitride layer can be formed by forming a silicon oxide layer by a heat treatment in an oxygen ambience after the hydrogen etching and before forming a silicon nitride layer.

Furthermore, this silicon nitride layer can be thermally grown in a simple process to obtain a denser layer than the silicon nitride layer deposited by CVD, and therefore it is less prone to reaction during the hydrogen annealing, its effect of preventing impurity diffusion lasts longer, and it assures the prevention of contamination of the silicon single crystal wafer by impurities.

BRIEF DESCRIPTION OF THE DRAWING

FIG. 1 is a partial cross section showing one example of the semiconductor heat treatment jig of the present invention.

FIG. 2 is a schematic cross section showing an example of the vertical-type heat treatment furnace used for the hydrogen annealing.

DETAILED DESCRIPTION

The present invention is described in detail below by referring to examples. Specific examples of the present invention are described below.

[Example 1]

Using a vertical-type heat treatment furnace shown in FIG. 2, a heat treatment of the wafer boat 12 made of silicon carbide was conducted in a hydrogen ambience, and then the silicon nitride layer 12b was formed on the surface of the silicon carbide 12a, as shown in FIG. 1. In detail, the wafer boat 12 was inserted in the vertical-type heat treatment furnace. After slightly etching the surface (0.1 micrometers) with a 2-hour heat treatment in a hydrogen ambience at 1,200° C., a 1-hour heat treatment in a nitrogen ambience at 1,200° C. was conducted to form the silicon nitride layer 12b with a thickness of approximately 1 micrometer on the wafer boat 12. Using this wafer boat 12, the CZ silicon single crystal wafers 11 were placed on the wafer boat 12 and then inserted in the vertical-type heat treatment furnace for 1 hour of hydrogen annealing at 1,200° C. The concentration of each of the metallic impurities, Cu, Fe, Cr and Ni, on the surfaces of the silicon single crystal wafers was measured using induced plasma mass spectroscopy (ICP-MS).

[Example 2]

The wafer boat 12 made of silicon carbide which has a surface protective layer formed by CVD was inserted in the vertical-type heat treatment furnace. After the surface was given hydrogen etching under the same conditions as in Example 1, a silicon nitride layer was formed. Using this wafer boat 12, the CZ silicon single crystal wafers 11 were placed on the wafer boat 12 and then inserted in the vertical-type heat treatment furnace for hydrogen annealing under the same conditions as in Example 1. The concentration of each of the metallic impurities, Cu, Fe, Cr and Ni, on the surfaces of the silicon single crystal wafers was measured using ICP-MS.

[Example 3]

After conducting the hydrogen etching on the wafer boat 12 made of silicon carbide, the silicon oxide layer was thermally grown and a heat treatment was conducted on the surface of the wafer boat 12 in a nitrogen ambience to form a silicon nitride layer. In detail, the wafer boat 12 was inserted in the vertical-type heat treatment furnace. After slightly etching the surface (0.1 micrometers) with a 2-hour heat treatment in a hydrogen ambience at 1,200° C., the wafer boat 12 was once taken out and the ambience in the furnace was replaced by a nitrogen ambience and then by a dry oxygen ambience. The wafer boat 12 was inserted again and a 2-hour heat treatment at 1,200° C. was conducted to form an approximately 0.5 micrometer-thick silicon oxide layer, and then a 1-hour heat treatment in a nitrogen ambience at 1,200° C. was conducted to form an approximately 1.2 micrometer-thick silicon nitride layer on the wafer boat 12. Using this wafer boat 12 with the surface treatments, the CZ silicon single crystal wafers 11 were placed on the wafer boat 12 and then inserted in the vertical-type heat treatment furnace for 1 hour of hydrogen annealing at 1,200° C. The concentration of each of the metallic impurities, Cu, Fe, Cr and Ni, on the surfaces of the silicon single crystal wafers was measured using ICP-MS.

[Comparative Example 1]

Using the wafer boat 12 made of silicon carbide, the CZ silicon single crystal wafers 11 were placed on the wafer boat 12 and then inserted in the vertical-type heat treatment furnace for hydrogen annealing under the same conditions as in Example 1. The concentration of each of the metallic impurities, Cu, Fe, Cr and Ni, on the surfaces of the silicon single crystal wafers was measured using ICP-MS.

[Comparative Example 2]

Using the wafer boat 12 made of silicon carbide which has a surface protective layer formed by the CVD method, the CZ silicon single crystal wafers 11 were placed on the wafer boat 12 and then inserted in the vertical-type heat treatment furnace for hydrogen annealing under the same conditions as in Example 1. The concentration of each of the metallic impurities, Cu, Fe, Cr and Ni, on the surfaces of the silicon single crystal wafers was measured using ICP-MS.

The measurements of the concentration of each of the metallic impurities, i.e. Cu, Fe, Cr and Ni, on the wafer surfaces treated in Example 1, Example 2, Comparative example 1 and Comparative example 2 are shown in Table 1.

TABLE 2

| | Metallic impurity concentration ($\times 10^{10}$ atoms/cm$^2$) | | | |
|---|---|---|---|---|
| | Cu | Fe | Cr | Ni |
| Example 1 | 1.5 | 3 | 0.7 | 0.1 |
| Example 2 | 1 | 2 | 0.5 | 0.1 |
| Example 3 | 1 | 0.7 | 0.5 | 0.1 |
| Comparative example 1 | 25 | 42 | 4 | 4 |
| Comparative example 2 | 8 | 17 | 2 | 1 |

As shown in Table 1, each Example has reduced concentrations of the metallic impurities compared with each Comparative example. Thus, it is confirmed that the out-diffusion of impurities from the heat treatment jig is suppressed in the Examples.

As described thus far, the present invention has an effect of reducing the out-diffusion of impurities from the material of the heat treatment jig by thermally growing a silicon nitride layer on the surface of the heat treatment jig. For example, the silicon wafers with 1-hour hydrogen annealing at 1,200° C. using this heat treatment jig showed a reduction to approximately a tenth of the concentrations of Cu and Fe, and also a substantial reduction in the concentrations of Cr and Ni.

What is claimed is:

1. A method for a surface treatment of a heat treatment jig for semiconductor wafers:

wherein a silicon nitride layer is thermally grown on a surface of the heat treatment jig composed of silicon or silicon carbide in a nitrogen ambience in the temperature range of 1,100° C.–1300° C.;

wherein the surface layer of said heat treatment jig is removed slightly by etching before thermally growing said silicon nitride layer; and wherein a silicon oxide layer is thermally grown in an oxygen ambience on the surface of said heat treatment jig after conducting said etching, and then said silicon nitride layer is thermally grown.

2. A method for a surface treatment of a heat treatment jig for semiconductor wafers according to claim 1:

wherein said etching is conducted by introducing hydrogen gas in a high temperature ambience.

* * * * *